(12) United States Patent
Sheu et al.

(10) Patent No.: US 6,764,863 B2
(45) Date of Patent: Jul. 20, 2004

(54) MEMORY-STORAGE NODE AND THE METHOD OF FABRICATING THE SAME

(75) Inventors: Bor-Ru Sheu, Hsinchu (TW);
Ming-Chung Chiang, Hsinchu (TW);
Chung-Ming Chu, Hsinchu (TW);
Min-Chieh Yang, Hsinchu (TW)

(73) Assignee: Winbond Electonics Corporation, Hsinchu (TW)

( * ) Notice: Subject to any disclaimer, the term of this patent is extended or adjusted under 35 U.S.C. 154(b) by 0 days.

(21) Appl. No.: 10/387,476

(22) Filed: Mar. 14, 2003

(65) Prior Publication Data

US 2003/0173613 A1 Sep. 18, 2003

Related U.S. Application Data

(62) Division of application No. 09/813,993, filed on Mar. 22, 2001, now Pat. No. 6,563,161.

(51) Int. Cl.$^7$ .......................................... H01L 21/8242
(52) U.S. Cl. ............................ 438/3; 438/240; 438/634
(58) Field of Search ............................ 438/3, 240, 253, 438/634, 686, 785

(56) References Cited

U.S. PATENT DOCUMENTS

| | | | |
|---|---|---|---|
| 5,471,364 A | 11/1995 | Summerfelt et al. | 257/295 |
| 5,489,548 A | 2/1996 | Nishioka et al. | 438/686 |

(List continued on next page.)

OTHER PUBLICATIONS

Choi et al., "Bottom Electrode Structures of Pt/RuO$_2$/Ru for Integration of (Ba,Sr)TiO$_3$ Thin Films on Polysilicon," Journal of the Electrochemical Society (1999), 146:4189–93.

(List continued on next page.)

*Primary Examiner*—Chandra Chaudhari
(74) *Attorney, Agent, or Firm*—Finnegan, Henderson, Farabow, Garrett & Dunner, L.L.P.

(57) ABSTRACT

The memory-storage node of the present invention includes a semiconductor substrate, a first insulating layer over the substrate, a conductive layer formed within the first insulating layer, and a barrier layer formed over the conductive layer. The barrier layer, preferably contains a ruthenium-based material, is conductively coupled with the conductive layer. The memory-storage node further includes a first electrode over the barrier layer, a dielectric layer over the first electrode, and a second electrode over the dielectric layer. The method for fabricating the memory storage-node of the present invention provides a semiconductor substrate and forms a first insulating layer on the substrate. A first opening is formed in the first insulating layer and a conductive layer is provided in the first opening. A barrier layer is then formed in the first opening and over the conductive layer. The barrier layer, preferably contains a ruthenium-based material, is conductively coupled with the conductive layer. A second insulating layer is formed over the first insulating layer and the barrier layer. A second opening is formed in the second insulating layer to expose a portion of the underlying barrier layer. A first electrode is formed in the second opening and a dielectric layer is formed on the second insulating layer and the first electrode. Finally, a second electrode is formed over the dielectric layer.

9 Claims, 8 Drawing Sheets

U.S. PATENT DOCUMENTS

| | | | |
|---|---|---|---|
| 5,504,041 A | 4/1996 | Summerfelt | 438/24 |
| 5,554,564 A | 9/1996 | Nishioka et al. | 438/240 |
| 5,554,866 A | 9/1996 | Nishioka et al. | 257/295 |
| 5,566,045 A | 10/1996 | Summerfelt et al. | 438/253 |
| 5,576,928 A | 11/1996 | Summerfelt et al. | 438/240 |
| 5,581,436 A | 12/1996 | Summerfelt et al. | 438/3 |
| 5,585,300 A | 12/1996 | Summerfelt | 438/240 |
| 5,589,284 A | 12/1996 | Summerfelt et al. | 428/697 |
| 5,619,393 A | 4/1997 | Summerfelt et al. | 438/240 |
| 5,626,906 A | 5/1997 | Summerfelt et al. | 427/79 |
| 5,665,628 A | 9/1997 | Summerfelt | 438/3 |
| 5,679,980 A | 10/1997 | Summerfelt | 257/751 |
| 5,696,018 A | 12/1997 | Summerfelt et al. | 438/785 |
| 5,729,054 A | 3/1998 | Summerfelt et al. | 257/751 |
| 5,781,404 A | 7/1998 | Summerfelt et al. | 257/295 |
| 5,851,896 A | 12/1998 | Summerfelt | 438/240 |
| 5,879,956 A | 3/1999 | Seon et al. | 438/240 |
| 5,909,043 A | 6/1999 | Summerfelt | 257/298 |
| 5,986,301 A | 11/1999 | Fukushima et al. | 257/306 |
| 6,090,659 A | 7/2000 | Laibowitz et al. | 438/240 |
| 6,218,296 B1 | 4/2001 | Kwak et al. | 438/3 |
| 6,222,220 B1 | 4/2001 | Lin et al. | 438/240 |
| 6,500,763 B2 * | 12/2002 | Kim et al. | 438/689 |
| 6,559,025 B2 * | 5/2003 | Kim | 438/240 |
| 2001/0038114 A1 | 11/2001 | Iijima et al. | 257/303 |

OTHER PUBLICATIONS

Hieda et al., "Low Temperature (Ba,Sr)TiO$_3$ Capacitor Process Integration (LTB) Technology for Gigabit Scaled DRAMs," International Electron Devices Meeting (Dec. 5–8), pp. 33.1.1–33.1.4. (1999).

Kim et al., "A DRAM technology using MIM BST capacitor for 0.15 βm DRAM generation and beyond," 1999 Symposium on VLSI Technology Digest of Technical Papers (Jun. 14–16, 1999), pp. 33–34.

Kotecki et al., "(Ba, Sr)TiO$_3$ dielectrics for future stacked–capacitor DRAM," IBM J. Res. Develop. (May 1999), 43:367–382.

Aoyama et al., "Chemical Vapor Deposition of Ru and its Application in (Ba, Sr)TiO$_3$ Capacitors for Future Dynamic Random Access Memories," Jpn. J. Appl. Phys. (1999), 38:2194–99.

Lee et al., "Integration Processes of (Ba, Sr)TiO$_3$ Capacitor for 1 Gb and Beyond," 1998 International Electron Devices Meeting (1998), pp. 30.4.1–30.4.4.

Aoyama et al. "Interfacial Layers between Si and Ru Films Deposited by Sputtering in Ar/O$_2$ Mixture Ambient," Jpn. J. Appl. Phys. (1998), 37:L242–L244.

Hwang, "(Ba, Sr)TiO$_3$ thin films for ultra large scale dynamic random access memory. A review on the process integration," Materials Science & Engineering (Nov. 1998), B56:178–190.

Izuha et al., "Electrical properties and microstrucuters of Pt/ba$_{0.5}$Sr$_{0.5}$TiO$_3$/SrRuO$_3$ capacitors," Appl. Phys. Lett. (Mar. 1997), 70:1405–07.

Wolf, "Silicon Processing for the VLSI Era: vol. 2—Process Integration," 1990, Lattice Press, 1$^{st}$ Ed., pp. 194–198.

Wolf and Tauber, "Silicon Processing for the VLSI Era: vol. 1—Process Technology," 2000, Lattice Press, 2$^{nd}$ Ed., pp. 728–729, 767–770, and 830–831.

* cited by examiner

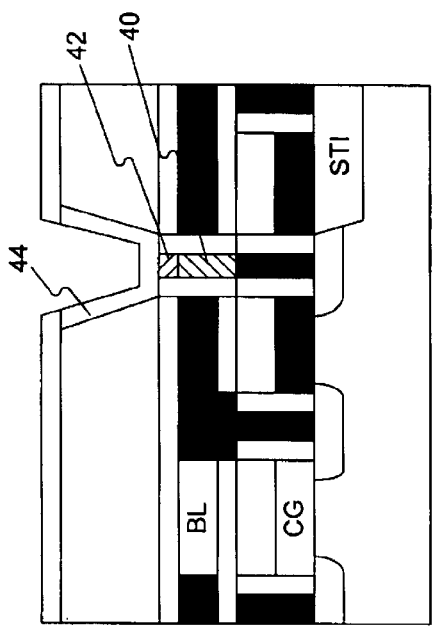
FIG. 3C (Prior Art)
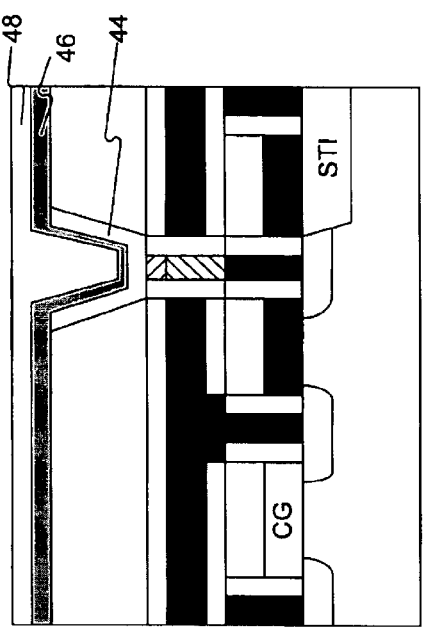
FIG. 3D (Prior Art)
FIG. 3A (Prior Art)
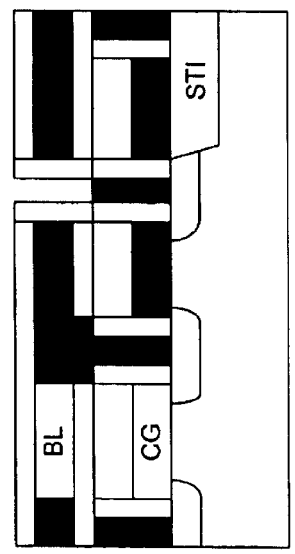
FIG. 3B (Prior Art)

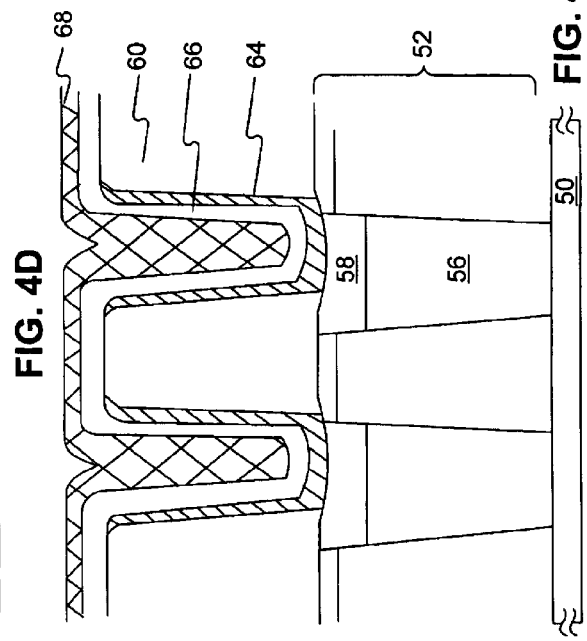
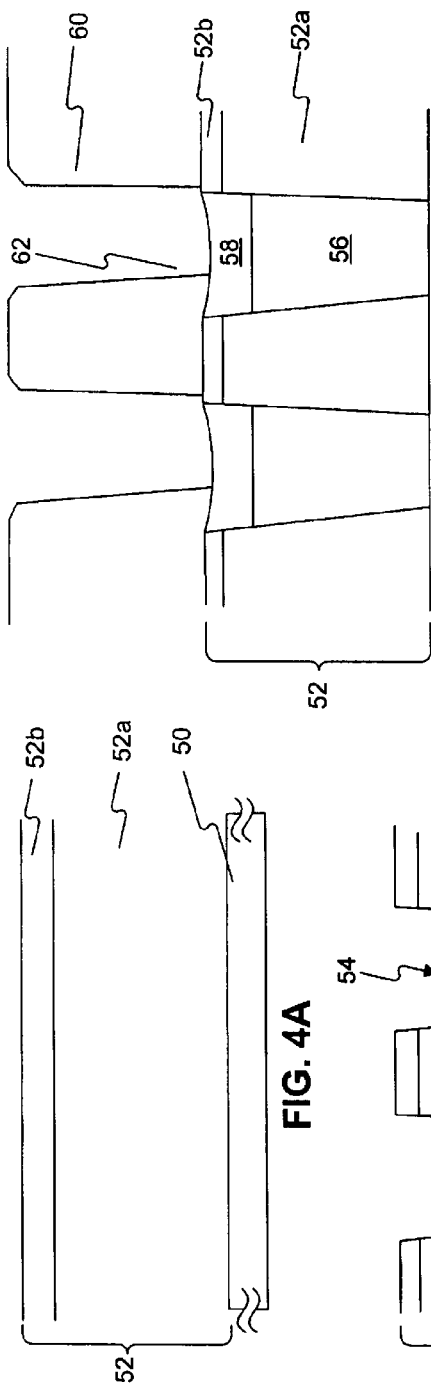
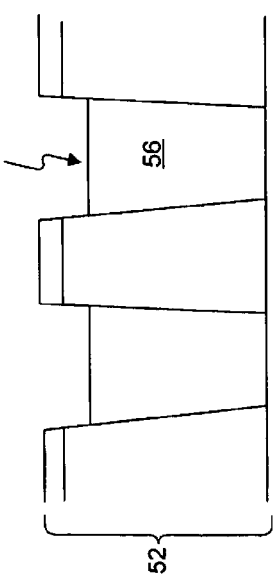
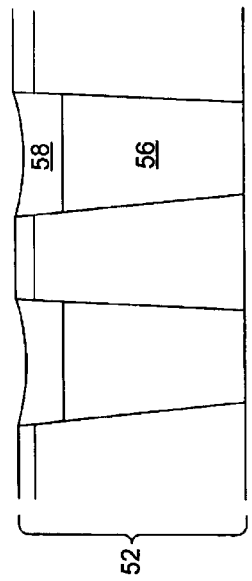

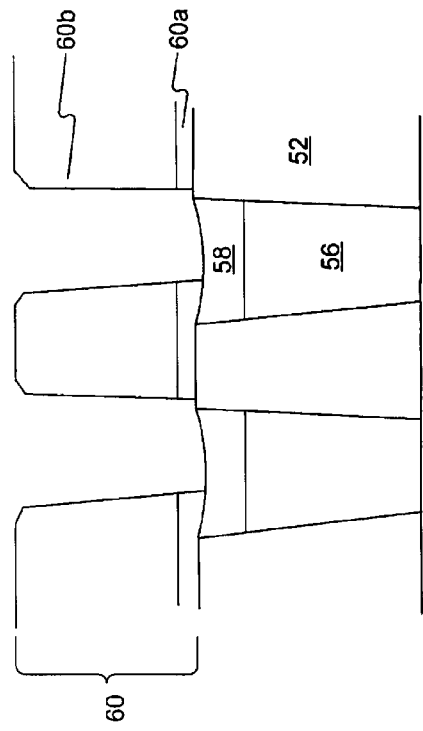
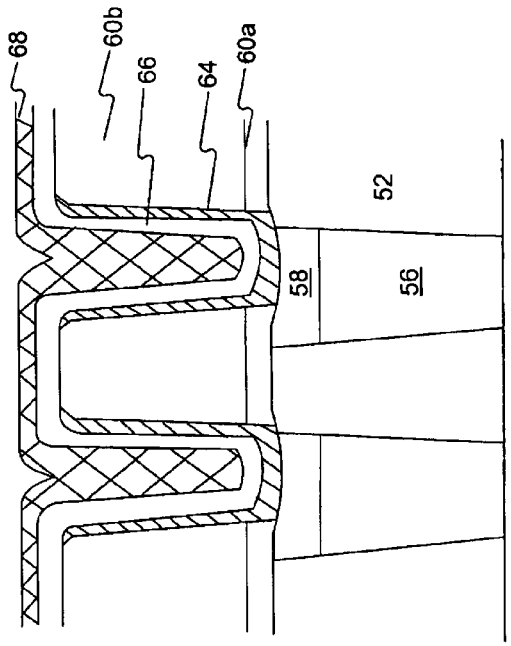
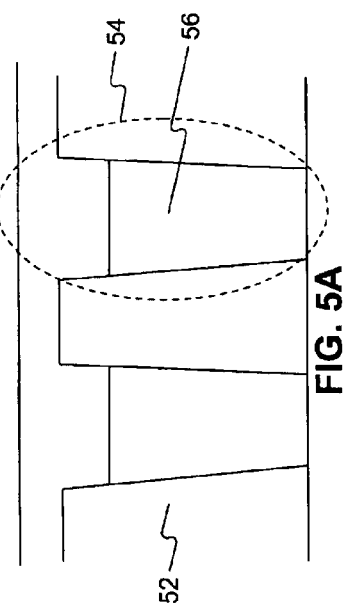
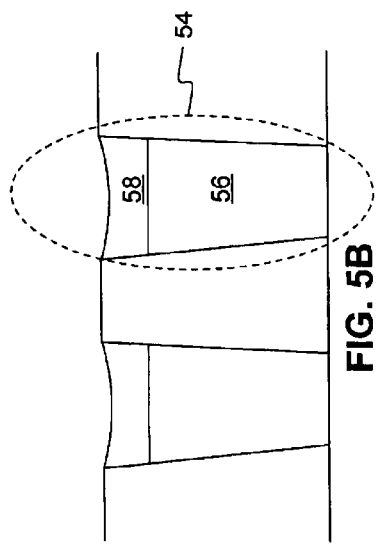
FIG. 5A
FIG. 5B
FIG. 5C
FIG. 5D

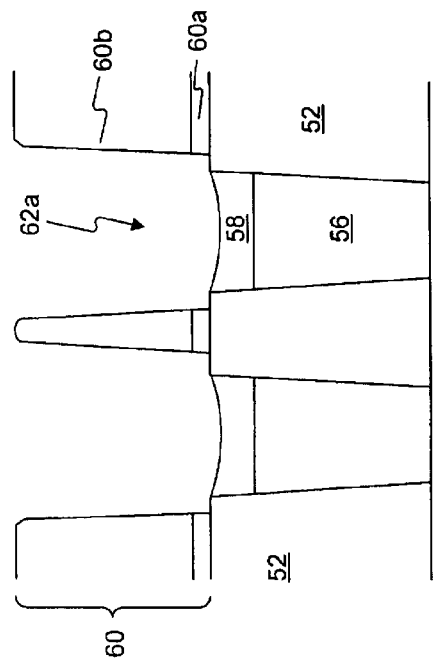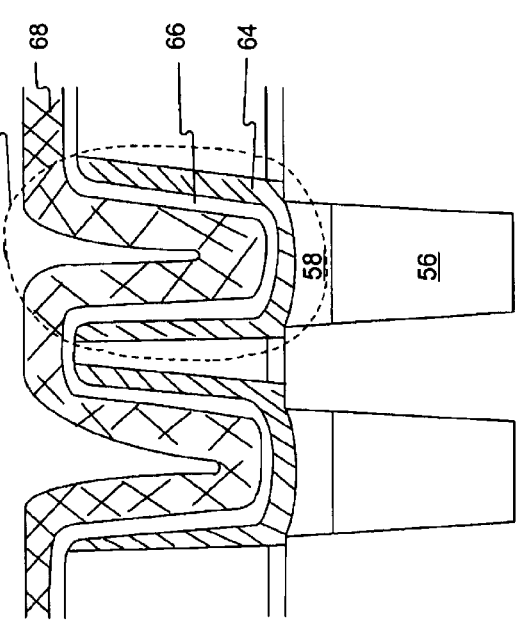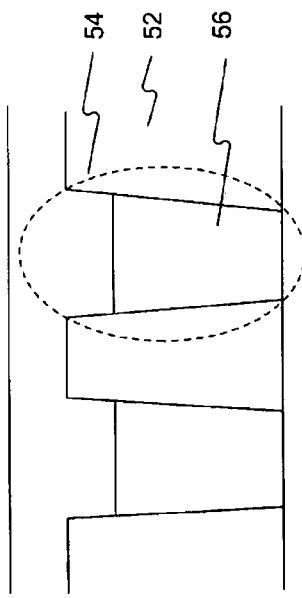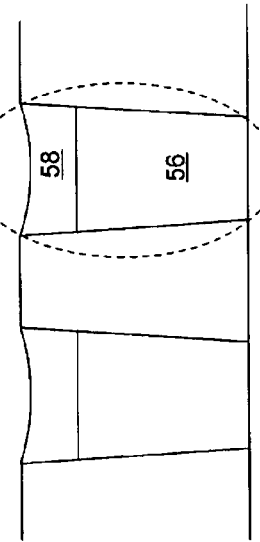

US 6,764,863 B2

MEMORY-STORAGE NODE AND THE METHOD OF FABRICATING THE SAME

This is a divison of application Ser. No. 09/813,993, filed March 22, 2001, now U.S. Pat. No. 6,563,161 which is incorporated in its entirety herein by reference.

BACKGROUND OF THE INVENTION

1. Field of the Invention

The present invention relates to a memory-storage node, and more specifically to the storage node of dynamic random access memories ("DRAMs").

2. Description of the Related Art

Dynamic random access memories ("DRAMs") constitute one of the most important memory devices in various electronic circuits. The ongoing development and improvement in the technology of fabricating DRAMs has enabled the semiconductor industry to provide high density, low cost, and reliable memory devices with a broad scope of applications.

In general, a DRAM cell consists of a memory cell capacitor and a transfer gate transistor. In order to provide a large number of memory cells on a limited area of a semiconductor substrate, the memory cell capacitor and the transfer gate transistor must be densely packed without losing their operational characteristics and efficiency. One of the continuing goals of development in the fabrication technology of DRAMs is to reduce the area that a capacitor occupies while maintaining the same storage capacity by using dielectrics with high dielectric constants, such as $BaSrTiO_3$ ("BST"). The use of the high dielectric constant dielectrics, however, creates new challenges to the manufacturing process of DRAMs. The process of applying these dielectrics often cause problems such as the incompatibility between the materials of neighboring layers, and the impact on the characteristics of each layer caused by the high temperature processes of forming these dielectrics.

Taking BST as an example, one of the difficulties in the process integration of2 BST capacitors occurs in the form of interface incompatibility. Most of the accompanying electrode materials used in modem technology, such as Pt, Ru, Ir, and conductive metal oxides, require a certain barrier layer at their interface with the underlying conductive plug. The conductive plug of metal or poly-crystalline silicon connects the capacitor with a cell transistor. Binary or ternary refractory metal nitrides, such as TiN, TiSiN, TiAlN, are used to protect the storage electrode from reacting with underlying silicon components of the conductive plug during several high temperature processes, including the BST film deposition, high temperature annealing, and insulating layer deposition. Binary or ternary refractory metal is also used to maintain the electrical conductivity of the barrier after all these processes have been performed.

The first major problem arises from the oxidization of the barrier layer and/or the underlying conductive plug of poly-crystalline silicon. A simple stack of barrier/electrode structure is prone to oxidation during the BST deposition because of the exposure of the side wall area to the atmosphere. When the barrier layer is buried in the contact plug, the side wall of the barrier is not exposed to the oxidizing atmosphere, the problem of contact oxidation is therefore reduced. The buried barrier scheme, however, might suffer from the oxidation problem if any displacement between the contact plug and electrode stack occurs. The modern process of high density and extremely small feature size, such as a relevant feature size of 0.13 µm and beyond, provides almost no tolerance against any misalignment between the contact hole and the electrode. As a result, the contact plug can be easily subject to oxidation for any minor misalignment.

FIGS. 1A–1F illustrate the prior art structure of a recessed barrier scheme. As shown in FIG. 1B, a contact plug 8 is formed within an opening in an insulation layer 6. FIG. 1C illustrates the formation of a SiN spacer 10 in the opening of the insulation layer 6. A Pt-encapsulated Ru storage node 12 is formed on a barrier layer 9, as shown in FIG. 1E. FIG. 1F illustrates that a Pt-spacer 14 is formed over the Ru storage node 12 and a BST layer 16 is formed over the Pt-spacer 14. The structure design requires the formation of the spacer 10 in FIG. 1C to avoid the misalignment problem during the process of forming a capacitor cell, and to eliminate the oxidation of the underlying contact plug 8. The addition of the spacer 10, however, complicates the whole process of fabricating the capacitor cell and increases the production time and cost.

FIGS. 2A–2D illustrate another type of BST capacitor integration in the prior art. The structure integrated a concave hole 26 on a buried-in, CVD-TiN plug 22 in FIG. 2A and the deposition of TiSiN glue layer 28 and Pt node electrode 30 in FIG. 2B. The structure also integrated the separation of a Pt node 30a from other Pt nodes in, FIG. 2C and the deposition of a BST thin film 32 and top electrode 34 in FIG. 2D. Referring to FIG. 2A, the formation of the concave hole 26 in this structure requires a silicon-dioxide etching of the upper silicon-dioxide layer 24 instead of metal electrode etching to form the storage node concave hole 26. Therefore, the process requires stringent etching-rate uniformity in order to ensure a wafer-wide uniformity for the formation of the concave hole 26 and the capacitance of capacitors, especially when the structure does not provide an etch-stop layer between the upper silicon-dioxide layer 24 and the underlying silicon-dioxide layer 20.

Other kinds of electrode contacts of BST capacitors have been proposed to resolve the problems, including polysilicon/Ti/TiN/RuO$_2$/BST/TiN/Al, polysilicon/Ru/BST/Ru, polysilicon/Ti/TiN/Pt/BST/plate-electrode, and metal plug/TiAlN/SrRuO$_3$/BST/SrRuO$_3$. Both Pt and Ru as electrode materials have adhesion problems with a silicon-dioxide film. A conductive perovskite-oxide, polycrystalline SrRuO$_3$ has been proposed to improve the adhesion. The direct contact between polysilicon and SrRuO$_3$, however, have been reported to result in two intermediate layers of amorphous silicon dioxide and Sr—Ru—Si oxide that are formed between a polysilicon plug and a SrRuO$_3$ electrode. Therefore, this proposed structure and process need the insertion of a barrier layer between contact plug and SrRuO$_3$ electrode in order to avoid interface incompatibility and provide a stable contact structure.

FIGS. 3A–3D illustrate the formation of a concave capacitor structure of metal plug/TiAlN/SrRuO$_3$/BST/SrRuO$_3$. FIGS. 3C and 3D illustrates the use of a metal plug 40, a TiAlN barrier layer 42, a first electrode 44 of SrRuO$_3$, a dielectric film 46 of BST, and a second electrode 48 of SrRuO$_3$.

The structure has its merits in several aspects. First, the BST crystallizing temperature is reduced by using SrRuO$_3$ electrodes 44 and 48 in FIG. 3D because SrRuO$_3$ has the same perovskite structure as a BST dielectric film 46. Second, the structure has no interfacial, low-dielectric layer between the BST film 46 and the SrRuO$_3$ electrodes 44 and 48, and thereby ensures the high dielectric constant of the BST capacitor. Third, the electrical characteristics of the BST capacitor is improved through lattice matching to reduce defects such as oxygen vacancies, and through smooth morphology at the interface between the BST film 46 and the SrRuO₃ electrodes 44 and 48. Finally, this prior art approach improves the electrical conductivity of the contact plug by using metallic materials as the plug 40. The approach also increases the tolerances of misalignment between the first electrode 44 and barrier 42/contact plug 40 by using the concave storage node, and obtains a better wafer-wide uniformity of the capacitance of capacitors through the improved control of concave-etching depth by using an etch-stop layer.

The oxidation resistance for TiN or TiAlN, however, is one of the concerns while using those materials as the barrier layer 42 between the SrRuO₃ electrode 40 and the contact plug 40 of either metal or polysilicon in FIG. 3D. Reports have shown that a TiAlN film has a better oxidation resistance than a TiN film. Aluminum of about 9% included in the TiN film is found to play an important role in increasing the oxidation resistance by forming an Al₂O₃ layer on the top surface. The thickness of the Al-rich (Al₂O₃) layer is usually more than 20 nm and would cause the reduced capacitance of the integrated BST capacitor.

Although BST capacitors provide several advantages over traditional capacitors and other types of capacitors made of different materials, the aforementioned process hurdles cause the problems of reduced performance, non-uniformity between the capacitor cells of the same wafer, and a tight tolerance for the manufacturing processes. Therefore, the application of BST as inter-electrode dielectrics needs an improved BST-capacitor formation process and structure that can avoid the oxidation problems and other process hurdles of the traditional approach.

SUMMARY OF THE INVENTION

Accordingly, the present invention is directed to a stacked capacitor storage node having a barrier in the contact-to-device area for a memory cell of a dynamic-random-access-memory (DRAM) device.

The present invention is also directed to a method for fabricating a memory-storage node with a perovskite electrode that substantially obviates one or more of the problems due to limitations and disadvantages of the related art.

The invention also discloses a concave-type storage node using conductive oxides of perovskite structures as an electrode material. An electrode is stacked on a recessed barrier of ruthenium or ruthenium-containing conductive film sitting on either a doped polycrystalline silicon contact plug or metal plug, such as tungsten or ruthenium plug.

The memory-storage node of the present invention includes a semiconductor substrate, a first insulating layer over the substrate, and a conductive layer formed within the first insulating layer. The memory-storage node also includes a barrier layer formed over the conductive layer. The barrier layer is conductively coupled with the conductive layer and preferably contains a ruthenium-based material. The memory-storage node further includes a first electrode over the barrier layer, a dielectric layer over the first electrode, and a second electrode over the dielectric layer.

The method for fabricating the memory storage-node of the present invention provides a semiconductor substrate and forms a first insulating layer on the substrate. A first opening is formed in the first insulating layer and a conductive layer is provided in the first opening. A barrier layer is then formed in the first opening and over the conductive layer. The barrier layer is conductively coupled with the conductive layer. In the preferred embodiments, the barrier layer contains a ruthenium-based material. A second insulating layer is formed over the first insulating layer and the barrier layer. A second opening is formed in the second insulating layer to expose a portion of the underlying barrier layer. A first electrode is formed in the second opening and a dielectric layer is formed on the second insulating layer and the first electrode. Finally, a second electrode is formed over the dielectric layer.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawings.

BRIEF DESCRIPTION OF THE DRAWINGS

The accompanying drawings, which are incorporated in and constitute a part of this specification, illustrate the embodiments of the invention and, together with the description, serve to explain the objects, advantages, and principles of the invention.

In the drawings:

FIGS. 3A–3D illustrate a concave capacitor structure of metal plug/TiAlN/SrRuO₃/BST/SrRuO₃ in the prior art.

FIGS. 4A–4E illustrate a first embodiment of a method for fabricating a memory-storage node that has an etch-stop layer formed as a part of a first insulation layer in accordance with the present invention.

FIGS. 5A–5D illustrate a second embodiment of a method for fabricating a memory-storage node that has an etch-stop layer formed as a part of a second insulating layer in accordance with the present invention.

FIGS. 7A–7D illustrate a fourth embodiment of a method for fabricating a memory-storage node that combines the second and third embodiments and has the etch-stop layer formed as a part of the second insulating layer and the enlarged second opening in accordance with the present invention.

DETAILED DESCRIPTION OF THE PREFERRED EMBODIMENTS

Figure 1A:
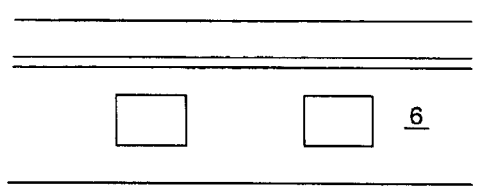
FIGS. 1A–1F illustrate the prior art structure of a recessed barrier scheme with a SiN spacer and a Pt-encapsulated, Ru-storage node.
Figure 1D:
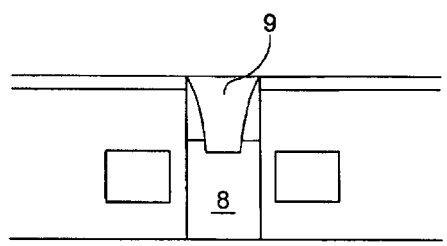
Figure 1B:
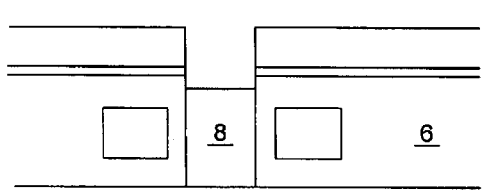
Figure 1E:
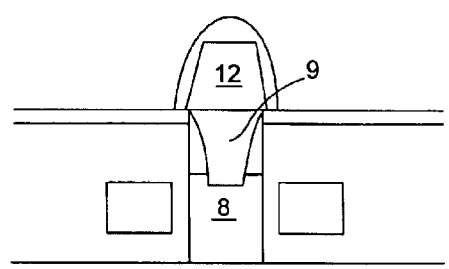
Figure 1C:
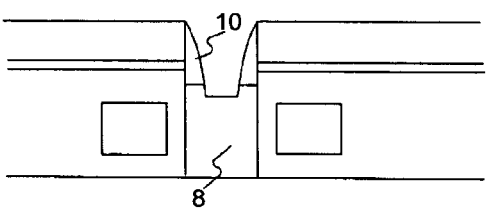
Figure 1F:
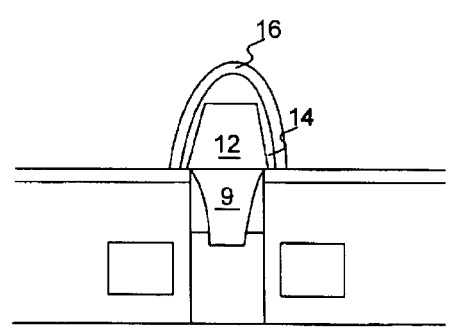
Figure 2A:
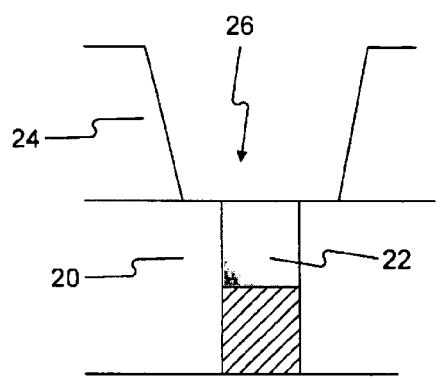
FIGS. 2A–2D illustrate a BST capacitor integration in the prior art that integrates a concave hole, a buried-in CVD-TiN-barrier plug, a TiSiN-glue layer and a BST thin film.
Figure 2B:
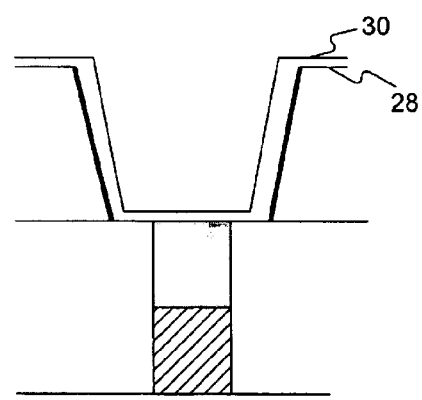
Figure 2C:
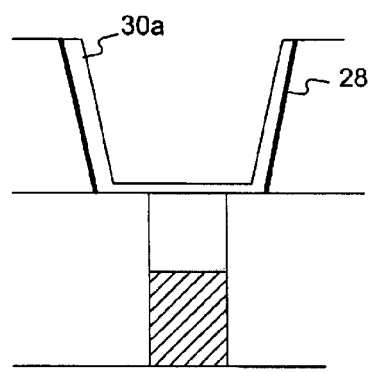
Figure 2D:
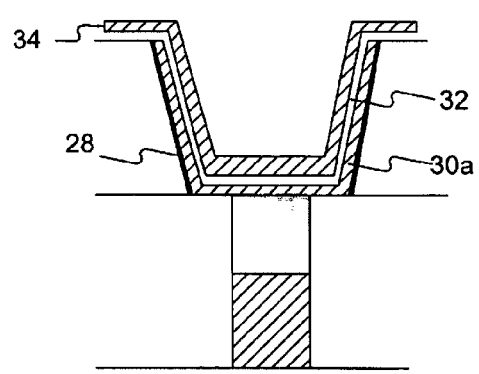

The present invention relates to a stacked capacitor storage node and the application of a layer of contact-to-device barrier in a memory cell for a dynamic random access memory (DRAM) device. The invention, more specifically, preferably includes a concave-type storage node using conductive oxides of perovskite structures, such as SrRuO₃, as an electrode material. A first electrode is stacked on a barrier layer of ruthenium or ruthenium-containing conductive film sitting on a conductive plug, such as a doped poly-crystalline-silicon-contact plug, a tungsten plug, a ruthenium plug, or other metal plugs.

To focus on the features of a method proposed in the present invention, the following description illustrates only the fabrication of one capacitor cell and another neighboring capacitor cell on a semiconductor substrate. It is well known for one skilled in the art that he or she may apply the same process to fabricate millions or billions of capacitor cells on a single wafer at the same time and the details for forming capacitors wafer-wide is not illustrated.

FIGS. 4A–4E illustrate a first embodiment of a method for fabricating a memory-storage node in the present invention. The process starts with a semiconductor substrate 50 in FIG. 4A. To focus on the formation process of a capacitor cell, the actual thickness of the substrate 50 is not reflected in FIG. 4A and the substrate is omitted in other drawings. For forming memory devices, the substrate 50 usually contains controlling circuits thereon, including transistors and wiring, in order to make contact with each capacitor cell and perform the functional operation of the memory devices. FIG. 4A illustrates a first insulating layer 52 formed on the substrate 50. The first insulating layer 52 can be a single layer of insulation, such as silicon dioxide, or preferably, can be a combination of a silicon dioxide layer 52a and an etch-stop layer 52b, such as silicon nitride or oxy-silicon nitride, over the silicon dioxide layer 52a.

FIG. 4B illustrates a first opening 54 formed in the first insulating layer 52 and a conductive layer 56 formed in the first opening 54. FIGS. 4B–4E also illustrate the formation of a neighboring capacitor cell at the same time to provide better understanding of the present invention. An etching process, combined with a lithography process for defining an area to be opened, is employed to form the first opening 54. The conductive layer 56 is a conductive plug formed in the first opening 54. Preferably, the conductive layer 56, which can be a metal plug, a poly-crystalline-silicon plug, or a combination thereof, does not fill up the whole opening 54 as illustrated in FIG. 4B.

FIG. 4C illustrates the formation of a barrier layer 58 in the first opening 54 and over the conductive layer 56. The barrier layer 58 serves as a conductive barrier and is conductively coupled with the underlying conductive layer 56. The barrier layer 58 in the present invention preferably uses ruthenium-based material such as ruthenium, ruthenium oxide, and their combination, such as a ruthenium-oxide/ruthenium film stack. In the preferred embodiment, the top surface of the barrier layer 58 and the top surface of the first insulating layer 52 are substantially co-planar, as shown in FIG. 4C. More preferably, the top surface of the barrier layer 58 has a recessed shape, with the central area being recessed and lower than the peripheral area of the top surface of the barrier layer 58, as shown in FIG. 4C. The recessed top surface provides one of the benefits of increasing interfacial contact area and thereby reducing interfacial contact resistance.

FIG. 4D illustrates a second insulating layer 60 formed over the first insulating layer 52 and the barrier layer 58. The second insulating layer 60 is preferably made with silicon dioxide, but other alternative insulating materials may be used as well. FIG. 4D also illustrates a second opening 62 formed in the second insulating layer 60 to expose a portion of the barrier layer 58. The second opening 62 can be formed by the combination of a lithography process and an etching process. In the preferred embodiment, the etch-stop layer 52b provides proper control of the etching process because this additional layer provides an identifiable stop point and improves the wafer-wide uniformity of forming the second opening 62 through the etching process.

FIG. 4E illustrates the formation of a first electrode 64, a dielectric layer 66, and a second electrode 68. The first electrode 64 is formed in the second opening 62, and the dielectric layer 66 is formed on the second insulating layer 60 and the first electrode 64. Finally, the second electrode 68 is formed over the dielectric layer 66. In the preferred embodiment, the first electrode is made of perovskite metal oxide, such as $SrRuO_3$. FIG. 4E indicates that the first electrode 64 was formed on the sidewalls and the bottom of the second opening 62 and the electrode 64 is conductively coupled with the conductive layer 56 through the barrier layer 58. Preferably, the first electrode 64 is formed by depositing a perovskite-metal oxide in the second opening 62 and also on the second insulating layer 60. The process then applies a removal step, such as a chemical-mechanical polishing or reactive ion etching, to remove the perovskite-metal oxide on the second insulating layer 60 and separate individual electrodes.

Preferably, the dielectric layer 66 used in the present invention has a high dielectric constant, a dielectric material having a dielectric constant of more than 100, such as a Ba—Sr—Ti-based material, or more specifically, $BaSrTiO_3$, can be employed. In addition, the second electrode 68 can be made of various conductive materials, such as noble metal, metal oxide, or the combination thereof More specifically, materials such as Pt, $SrRuO_3$, $RuO_2$, or the combination thereof can be used.

FIGS. 5A–5D illustrate another embodiment of the present invention that has an etch-stop layer formed as a part of a second insulating layer. FIG. 5A illustrates a first insulating layer 52 made of a single layer of insulation, such as silicon dioxide, rather than the combination of the silicon dioxide layer 52a and the etch-stop layer 52b shown in FIG. 4A. FIG. 5A also illustrates the formation of the first opening 54 and the conductive layer 56.

FIG. 5B illustrates the formation of a barrier layer 58 in the first opening 54 and over the conductive layer 56. FIG. 5C illustrates a second insulating layer 60 formed over the first insulating layer 52. The second insulating layer 60 in this embodiment is preferably made of a bottom etch-stop layer 60a, such as silicon nitride or oxy-silicon nitride, and a silicon dioxide layer 60b formed over the bottom etch-stop layer 60a. Therefore, the etch-stop layer 60a provides a proper control of the etching process with an identifiable stop point and improves the wafer-wide uniformity of forming the second opening 62 through the etching process. FIG. 5D illustrates the formation of a first electrode 64, a dielectric layer 66, and a second electrode 68, in a similar way as shown in FIG. 4E.

Figure 6A:
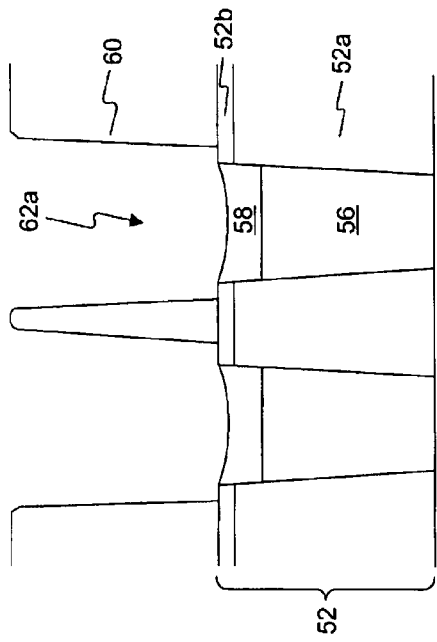
FIGS. 6A–6D illustrate a third embodiment of a method for fabricating a memory-storage node that forms an enlarged second opening in accordance with the present invention.
Figure 6B:
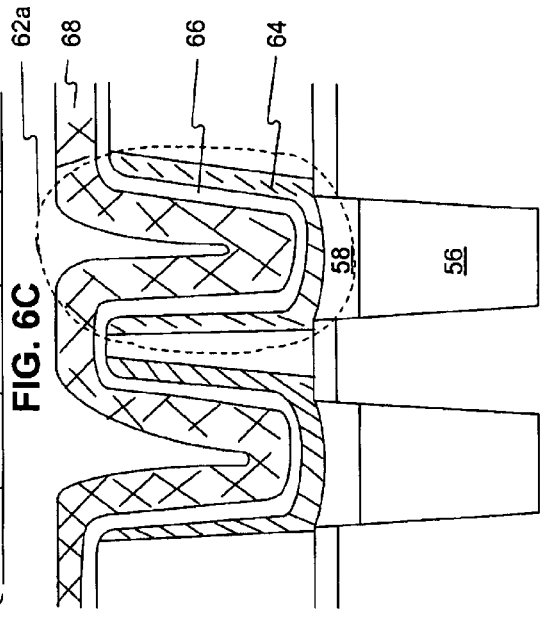
Figure 6C:
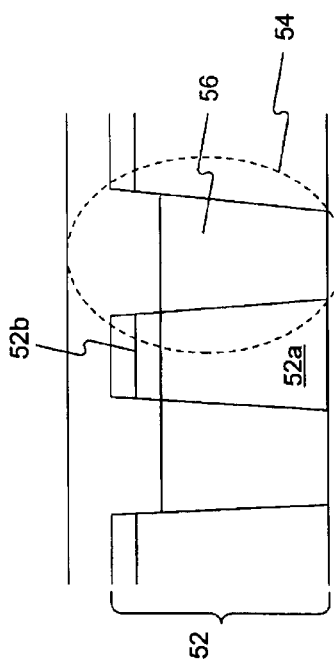

FIGS. 6A–6D illustrate another embodiment of the present invention that forms an enlarged second opening 62a in FIG. 6C. FIG. 6A illustrates the formation of a first insulating layer 52 made of a silicon dioxide layer 52a and an etch-stop layer 52b of a different material, such as silicon nitride or oxy-silicon nitride. FIG. 6A also illustrates the formation of a first opening 54 in the first insulation layer 52 and the conductive layer 56. FIG. 6B illustrates the formation of a barrier layer 58 in the first opening 54 and over the conductive layer 56.

FIG. 6C illustrates the second insulating layer 60 formed over the first insulating layer 52. FIG. 6C also illustrates the formation of the enlarged second opening 62a in the second insulating layer 60 to expose the whole, or at least a large part of the top surface of the barrier layer 58. The enlarged second opening 62a can be formed by the combination of a lithography process and an etching process. In the preferred embodiment, the etch-stop layer 52b provides a proper control of the etching process of the enlarged second opening 62a with an identifiable stop point and improves the wafer-wide uniformity of forming the second opening 62a. Therefore, the etching process of the enlarged second opening 62a can be easily controlled without the threat of over-etching or under-etching. In the preferred embodiment, the second opening 62a is formed in the second insulating layer 60 using an etching process such as an isotropic dry etching, chemical dry etching, wet etching, and the combination thereof.

Figure 6D:
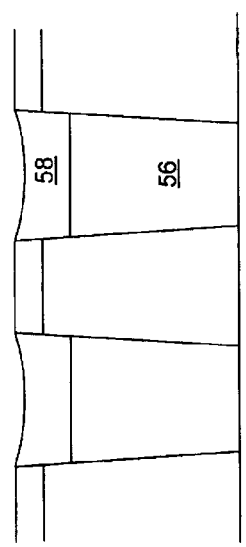

FIG. 6D illustrates the formation of the first electrode 64, the dielectric layer 66, and the second electrode 68, in a similar way as shown in FIG. 4E. The increased surface area exposed on the top of the barrier layer 58 increases its contact area with the first electrode 64 and provides lower resistance for high speed operation of memory cells.

FIGS. 7A–7D illustrate a fourth embodiment of the present invention that combines some of the features of the second and third embodiments of the present invention. This embodiment, as illustrated in FIG. 7C, has the etch-stop layer 60a formed as a part of the second insulating layer 60, and has the enlarged second opening 62a as well. FIG. 7A illustrates the formation of a first insulating layer 52 made of a single layer of insulation, such as silicon dioxide. FIG. 7A also illustrates the formation of a first opening 54 and a conductive layer 56. Moreover, the enlarged second opening 62a shown in FIG. 7C also provides more space for forming the capacitor cell and increase the cell's capacitance by increasing the surface area of a first electrode 64, as illustrated in FIG. 7D.

FIG. 7B illustrates the formation of a barrier layer 58 in the first opening 54 and over the conductive layer 56. FIG. 7C illustrates a second insulating layer 60 formed over the first insulating layer 52. The second insulating layer 60 is made of a bottom etch-stop layer 60a, such as silicon nitride or oxy-silicon nitride, and a silicon dioxide layer 60b over the bottom etch-stop layer.

FIG. 7C illustrates the formation of the enlarged second opening 62a in the second insulating layer 60, including both the etch-stop layer 60a and the silicon dioxide layer 60b, in order to expose the whole top surface of the barrier layer 58. The enlarged second opening 62a can be formed by the combination of a lithography process and an etching process. In this preferred embodiment, the etch-stop layer 60a provides a proper control of the etching process of the enlarged second opening 62a with an identifiable stop point and improves the wafer-wide uniformity of forming the second opening 62a. Therefore, the etching process can be easily controlled without the threat of over-etching or under-etching. In the preferred embodiment, the second opening 62a is formed in the second insulating layer 60 using an etching process such as isotropic dry etching, chemical dry etching, wet etching, and the combination thereof.

FIG. 7D illustrates the formation of a first electrode 64, a dielectric layer 66, and a second electrode 68, in a similar way as shown in FIG. 4E. The increased surface area exposed on the top of the barrier layer 58 in FIG. 7D increases its contact area with the first electrode 64 and provides lower resistance for high speed operation of memory cells. Moreover, the enlarged second opening 62a also provides more space for forming the capacitor cell and increases the capacitance by increasing the surface area of the first electrode 64 in FIG. 7D.

FIGS. 4E, 5D, 6D, and 7D illustrate four different embodiments of the memory-storage node of the present invention. The basic structures of these embodiments are similar. Taking the embodiment in FIG. 4E as an example, the memory-storage node of the present invention includes a semiconductor substrate 50, a first insulating layer 52 over the substrate 50, and a conductive layer 56 formed in the first insulating layer 52. The conductive layer 56 is conductively coupled with an underlying region, which can be part of the substrate 52, such as a source region of a passing transistor, or a region on other layers formed over the substrate 52 that has to be coupled with a capacitor.

Referring to FIG. 4E, the memory-storage node also includes a barrier layer 58 formed over the conductive layer 56. The barrier layer 58 is conductively coupled with the conductive layer 56 and preferably contains a ruthenium-based material. The memory-storage node further includes a first electrode 64 over the barrier layer 58, a dielectric layer 66 over the first electrode 64, and a second electrode 68 over the dielectric layer 66.

Preferably, the memory-storage node may also include a second insulating layer 60 formed on the first insulating layer 52 and has the second insulating layer 60 provide an opening 62 as shown in FIG. 4D. The first electrode 64 in FIG. 4E, therefore, is formed within the opening 62 in FIG. 4D and conductively coupled with the barrier layer 58. The embodiments in FIGS. 5C and 7C illustrate that the second insulating layer 60 can be a combination of a bottom etch-stop layer 60a and an oxide layer 60b over the bottom etch-stop layer 60a. As alternative embodiments, FIGS. 4D and 6C illustrate that an etch-stop layer can be provided by a first insulating layer 52 made of an oxide layer 52a and an etch-stop layer 52b over the oxide layer 52a.

As illustrated above in the preferred embodiments in FIGS. 4D, 5C, 6C, and 7C, the top surface of the barrier layer 58 and the top surface of the first insulating layer 52 are substantially co-planar. The barrier layer 58 may also have a recessed top surface as show in those figures. The barrier layer 58 is preferably contains a ruthenium-based material, such as ruthenium, ruthenium oxide, or the combination thereof. In the preferred embodiments, the first electrode 64 uses perovskite metal oxide, and the dielectric layer 66 has a dielectric constant of more than 100 and may employ materials such as $BaSrTiO_3$. The second electrode 68 may use conductive materials such as noble metal, metal oxide, and the combination thereof.

Figure 8:
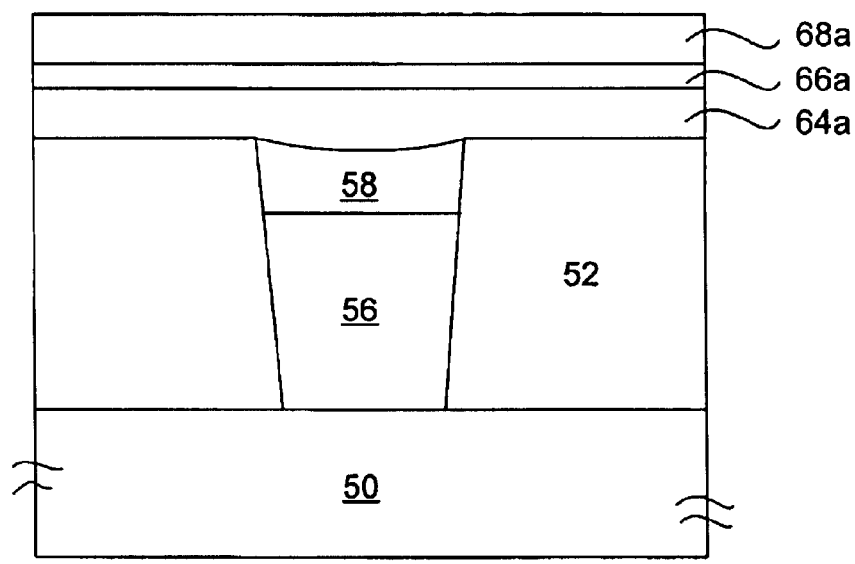
FIG. 8 illustrates the structure of a memory-storage device that has a flat-plate capacitor and a barrier layer between a conductive layer and a first electrode in accordance with the present invention.

The embodiments in FIGS. 4E, 5D, 6D, and 7D illustrate a memory-storage node that has the electrodes 64 and 68 formed within a concave hole. The present invention, however, does not limit the shape of the memory-storage node to any specific shape. FIG. 8 illustrates the most basic structure of forming a memory-storage. The memory-storage node has a basic structure of a substrate 50, a first insulating layer 52, and a conductive layer 56. The memory-storage node in the present invention has a barrier layer 58, preferably contains a ruthenium-based material, formed between the conductive layer 56 and a first electrode 64a to avoid the oxidation problems caused by the processes of forming BST dielectrics. As illustrated in FIG. 8, the memory-storage node also includes the first electrode 64a over the barrier layer 58, a dielectric layer 66a over the first electrode 64a, and a second electrode 68a over the dielectric layer 66a. FIG. 8 illustrates the basic combination of using two electrodes and a dielectric layer to form a flat-plate capacitor. Skilled artisans, after acknowledging the present invention, may apply the barrier layer design or equivalent barrier-layer structure of the present invention to form various kinds of capacitor structures of different shapes. The present invention does not intend to limit its application to any specific shape of capacitors or electrodes.

The present invention preferably uses an alternative barrier layer 58 utilizing a ruthenium-based material, such as ruthenium, ruthenium-oxide, or a ruthenium-oxide/ruthenium stack structure, as illustrated in FIGS. 4C, 5C, 6C, and 7C. The proposed approach has several, but not limited to the following, advantages. First, the ruthenium-based barrier layer 58 prevents the oxidation of the underlying plug 56 during the process of forming the first electrode 64 and the dielectric film 66. Second, the present invention retains all the superior characteristics of a $SrRuO_3$/BST/plate electrode capacitor. The possible presence of the conductive ruthenium-based-barrier layer 58, such as ruthenium-oxide layer, in the electrode/contact stack (56, 58 and 64) does not degrade the total capacitance of the integrated BST capacitor. Third, the invention increases the tolerances to the misalignment between the first electrode 64 and barrier/contact plug 56 and 58, and obtains a wafer-wide uniformity of the capacitance of capacitors because the approach provides a better control of concave-etching depth through the use of the etch-stop layer 52b in FIGS. 4C and 6C, or the etch-stop layer 60a in FIGS. 5C and 7C.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claims is:

1. A method for fabricating a memory-storage node, comprising:

providing a semiconductor substrate;

forming a first insulating layer over said substrate;

forming a first opening in said first insulating layer;

providing a conductive layer in said first opening;

forming a barrier layer in said first opening and over said conductive layer, said barrier layer being conductively coupled with said conductive layer, said barrier layer comprising ruthenium, wherein said barrier layer has a recessed top surface;

forming a second insulating layer over said first insulating layer and said barrier layer;

forming a second opening in said second insulating layer, said second opening exposing a portion of said barrier layer;

forming a first electrode in said second opening;

forming a dielectric layer on said second insulating layer and said first electrode; and forming a second electrode over said dielectric layer.

2. The method as claimed in claim 1, wherein said barrier layer is selected from the group consisting of ruthenium, ruthenium oxide, and the combination thereof.

3. The method as claimed in claim 1, wherein said second insulating layer comprises a bottom etch-stop layer and an oxide layer over said bottom etch-stop layer.

4. The method as claimed in claim 1, wherein said first electrode comprises perovskite metal oxide.

5. The method as claimed in claim 1, wherein said first electrode forms on the sidewalls and the bottom of said second opening.

6. The method as claimed in claim 1, wherein said dielectric layer comprises $BaSrTiO_3$.

7. The method as claimed in claim 1, wherein said second opening in said second insulating layer is formed to expose the whole top surface of said barrier layer.

8. The method as claimed in claim 1, wherein said first insulating layer comprises an oxide layer and an etch-stop layer over said oxide layer.

9. The method as claimed in claim 1, wherein said conductive layer is a conductive plug selected from the group consisting of a metal plug, poly-crystalline-silicone plug, or a combination thereof.

* * * * *